(12) United States Patent
Kim et al.

(10) Patent No.: US 7,491,560 B2
(45) Date of Patent: Feb. 17, 2009

(54) FABRICATING METHOD OF FLAT PANEL DISPLAY DEVICE

(75) Inventors: Jin Wuk Kim, Uiwang-si (KR); Mi Kyung Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 290 days.

(21) Appl. No.: 11/474,361

(22) Filed: Jun. 26, 2006

(65) Prior Publication Data
US 2007/0004074 A1    Jan. 4, 2007

(30) Foreign Application Priority Data
Jun. 30, 2005    (KR) .................. 10-2005-0057966

(51) Int. Cl.
*H01L 21/00* (2006.01)
(52) U.S. Cl. .............................. 438/30; 438/22; 438/42; 257/E21.001; 257/E21.585

(58) Field of Classification Search .................... 438/30, 438/42; 257/E21.001, E21.585
See application file for complete search history.

(56) References Cited

U.S. PATENT DOCUMENTS

| | | | | |
|---|---|---|---|---|
| 5,512,328 A | * | 4/1996 | Yoshimura et al. | 427/498 |
| 2004/0251171 A1 | * | 12/2004 | Iida et al. | 209/1 |

* cited by examiner

*Primary Examiner*—Walter L Lindsay, Jr.
*Assistant Examiner*—Abdulfattah Mustapha
(74) *Attorney, Agent, or Firm*—McKenna Long & Aldridge LLP

(57) ABSTRACT

A fabricating method of a flat panel display device according to the present invention includes providing a thin film on a substrate; providing a soft mold having a groove and a projection on the thin film; contacting the projection of the soft mold and the thin film; and spreading a hydrophilic polymer resin on the thin film to pattern the thin film.

20 Claims, 21 Drawing Sheets

FIG.11

| Sample | $\delta[b]$ $(cal/cm^3)^{1/2}$ | $(\delta_{resin}-\delta_{PDMS})^2$ $(cal/cm^3)$ |
|---|---|---|
| PEGDMA<br>GMA<br>BMA<br>PDMS | 10.9<br>9.8<br>8.4<br>7.3 | 12.96<br>6.25<br>1.21 |

FABRICATING METHOD OF FLAT PANEL DISPLAY DEVICE

This application claims the benefit of Korean Patent Application No. P2005-0057966, filed on Jun. 30, 2005, which is hereby incorporated by reference for all purposes as if fully set forth herein.

BACKGROUND OF THE INVENTION

1. Field of the Invention

The present invention relates to a fabricating method of a flat panel display device, and more particularly to a fabricating method of a flat panel display device that can reduce its manufacturing cost.

2. Discussion of the Related Art

Generally, a liquid crystal display (LCD) device controls a light transmittance of liquid crystal in accordance with a video signal, thereby displaying a picture. To this end, the liquid crystal display device includes a liquid crystal display panel where liquid crystal cells are arranged in a matrix shape, and a drive circuit for driving the liquid crystal display panel.

The liquid crystal display device is mainly divided into two modes in accordance with the direction of an electric field in which a liquid crystal is driven: a twisted nematic (TN) mode where a vertical electric field is applied and an in-plane switch (IPS) mode where a horizontal electric field is applied.

The TN mode is a mode of driving the liquid crystal by a vertical electric field between a pixel electrode of a lower substrate and a common electrode of an upper substrate that face each other. The TN mode has an advantage of a high aperture ratio, but its viewing angel is narrow. On the other hand, the IPS mode is a mode of driving the liquid crystal by a horizontal electric field between a pixel electrode and a common electrode that are arranged parallel to each other on a lower substrate. The IPS mode has an advantage of a wide viewing angle, but its aperture ratio is low.

FIG. 1 is a cross-sectional view representing a TN mode liquid crystal display panel according to the related art.

Referring to FIG. 1, the liquid crystal display panel includes an upper array substrate where a black matrix 54, a color filter 56, a common electrode 68 and an upper alignment film 58 are sequentially formed on an upper substrate 52; a lower array substrate where a TFT, a pixel electrode 66 and a lower alignment film 88 are formed on a lower substrate 82; and a liquid crystal 16 injected into an inner space between the upper array substrate and the lower array substrate.

In the upper array substrate, the black matrix 54 provides a cell area where the color filter 56 is to be formed, prevents light leakage and absorbs external light so as to increase the contrast ratio. The color filter 56 is formed in the cell area that is divided by the black matrix 54. The color filter 56 includes R, G and B color filter layers to display color images on the liquid crystal display panel. A common voltage is supplied to the common electrode 68 for controlling the movement of the liquid crystal 16. For the IPS mode where a horizontal electric field is applied, the common electrode 68 is formed on the lower array substrate.

In the lower array substrate, the TFT includes a gate electrode 59 formed on the lower substrate 82 together with the gate line (not shown); a semiconductor layer 64, 97 overlapping the gate electrode 59 with a gate insulating film 94 therebetween; and a source and drain electrode 90, 92 formed together with the data line (not shown). The TFT supplies a pixel signal from the data line to the pixel electrode 66 in response to a scan signal from the gate line.

The pixel electrode 66 is formed of a transparent conductive material with a high light transmittance ratio and is in contact with a drain electrode 92 of the TFT with a passivation film 100 therebetween. Upper and lower alignment films 58, 88 for aligning the liquid crystal 16 are formed by performing a rubbing process after spreading an alignment material such as polyimide.

The thin film patterns including the gate electrode 59 of the liquid crystal display panel are mainly formed by a photolithography process using a mask. FIGS. 2A to 2D are cross-sectional views illustrating a step by step formation of a gate electrode using a photolithography process.

Referring to FIG. 2A, a gate metal 59a and a photoresist 60 are deposited on the lower substrate 82 by a deposition method such as sputtering, and a mask 61 having an aperture is aligned with areas where the gate electrodes 59 are to be formed. Then, an exposure process and a development process are performed to form a photoresist pattern 60a shown in FIG. 2B, an etching process is performed to pattern the gate electrode 59 as shown in FIG. 2C. Finally, the gate electrode 59 is completed by a stripping process as shown in FIG. 2D.

Generally, a photolithography process includes depositing a photoresist, aligning a mask, exposing the photoresist to light and developing the photoresist, and etching the subject using the photoresist. Thus the photolithography process is complicated and a developing solution for developing the photoresist pattern is wasted. Also, the exposure process requires expensive equipment.

SUMMARY OF THE INVENTION

Accordingly, the present invention is directed to a fabricating method of a flat panel display device that substantially obviates one or more of the problems due to limitations and disadvantages of the related art.

An advantage of the present invention is to provide a method of fabricating a flat panel display device that can reduce its manufacturing cost.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a fabricating method of a flat panel display device includes providing a thin film on a substrate; providing a soft mold having a groove and a projection on the thin film; contacting the projection of the soft mold the thin film; and spreading a hydrophilic polymer resin on the thin film to pattern the thin film.

In another aspect of the present invention, a fabricating method of a flat panel display device includes providing a thin film on a substrate; providing a soft mold including a groove and a projection on the thin film; contacting the thin film with the projection of the soft mold to make the contacted area hydrophobic; spreading a hydrophilic polymer resin on the thin film to pattern the hydrophilic polymer resin; and patterning the thin film using the patterned hydrophilic polymer resin as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 11 shows the solubility parameters of the PDMS soft mold, PEGDMA, GMA and BMA;

DETAILED DESCRIPTION OF THE ILLUSTRATED EMBODIMENTS

Reference will now be made in detail to embodiments of the present invention, examples of which are illustrated in the accompanying drawings.

FIGS. 3A to 3F are cross-sectional views illustrating a formation of a gate electrode according to the present invention.

Figure 1:
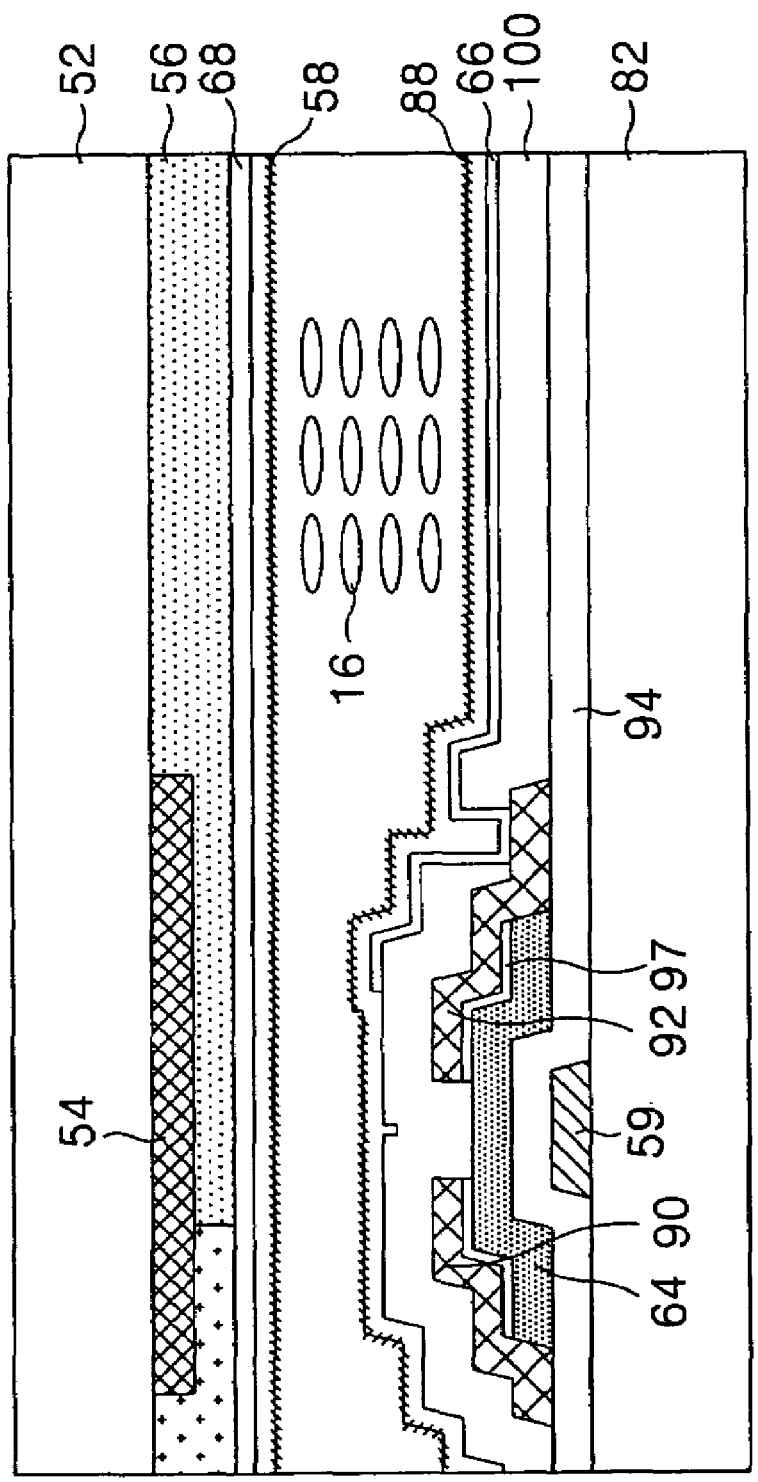
FIG. 1 is a cross-sectional view illustrating a TN mode liquid crystal display panel according to the related art.
Figure 2A:
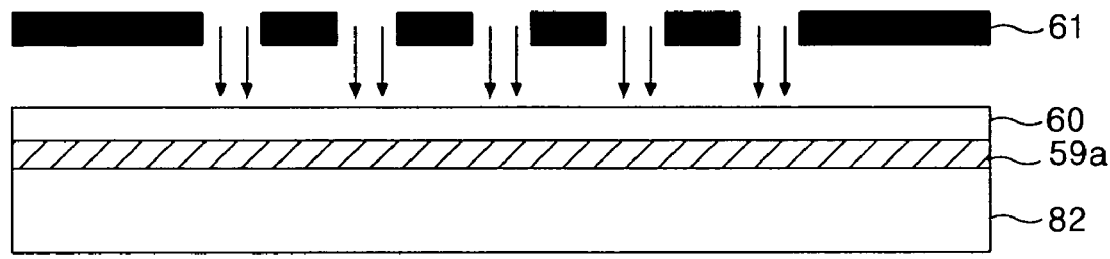
FIGS. 2A to 2D are cross-sectional views illustrating a formation of a gate electrode by a photolithography process.
Figure 2B:
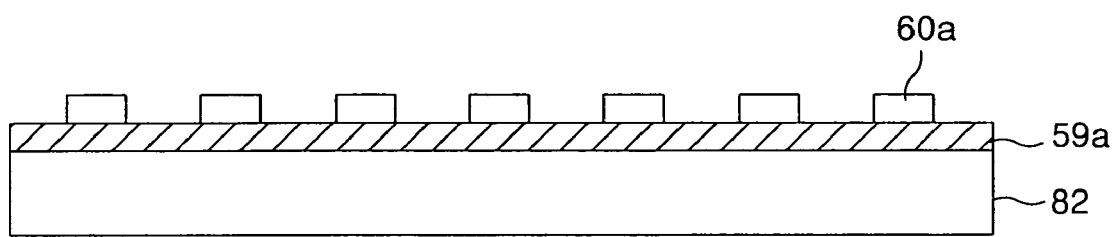
Figure 2C:
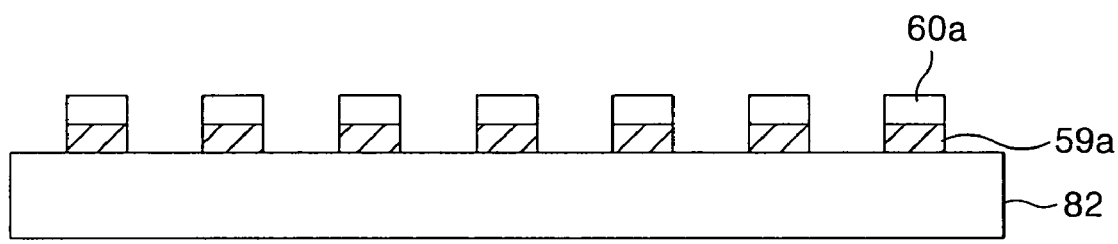
Figure 2D:
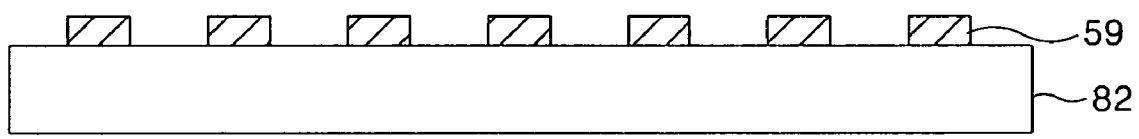
Figure 3A:
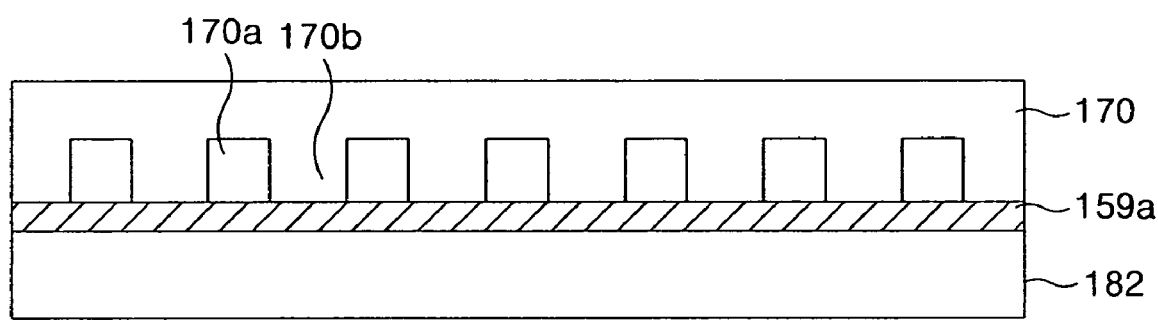
FIGS. 3A to 3F are cross-sectional views illustrating a formation of a gate electrode according to the present invention.

Referring to FIG. 3A, a soft mold 170 has a plurality of grooves 170a formed at areas corresponding to areas where gate electrodes will be formed, and a plurality of projections 170b formed at the remaining areas. Thereafter, the soft mold 170 is aligned and contacted with a gate metal layer 159a.

An example of the soft mold 170 is disclosed in Korean patent application No. 2003-0098122 that was previously applied for by the applicant of the present invention. The soft mold 170 is made of a rubber material with a high elasticity, such as polydimethylsiloxane ("PDMS").

Such a PDMS soft mold 170 may be formed, for example, by placing a PDMS soft mold material in a master mold having a desired pattern, mixing a main PDMS chain and a curing agent in a ratio of about 10:1, and curing the PDMS soft mold material with heat.

Figure 3B:
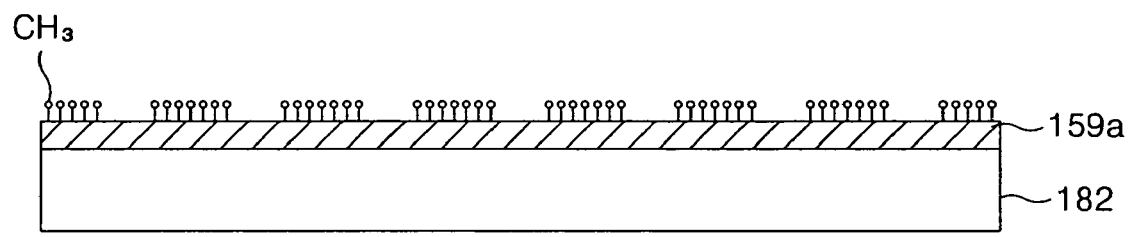

An uncured monomer component or an oligomer component of the PDMS soft mold material remains on a surface of the PDMS mold 170. When the PDMS soft mold 170 is contacted with the gate metal layer 159a, hydrophobic radical $CH_3$ of the uncured monomer component or the oligomer component is attached to the gate metal layer 159a. As a result, the areas of the gate metal layer 159a with which the projections 170b of the PDMS soft mold 170 are contacted are attached with the hydrophobic radical $CH_3$ of the uncured monomer component or the oligomer component of the PDMS soft mold 170, as illustrated in FIG. 3B.

Figure 3C:
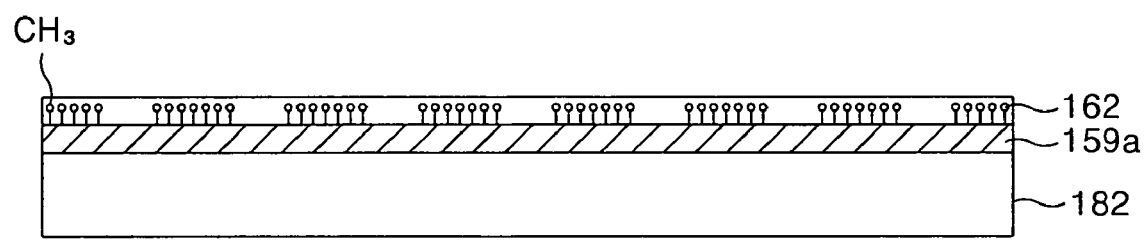
Figure 3D:
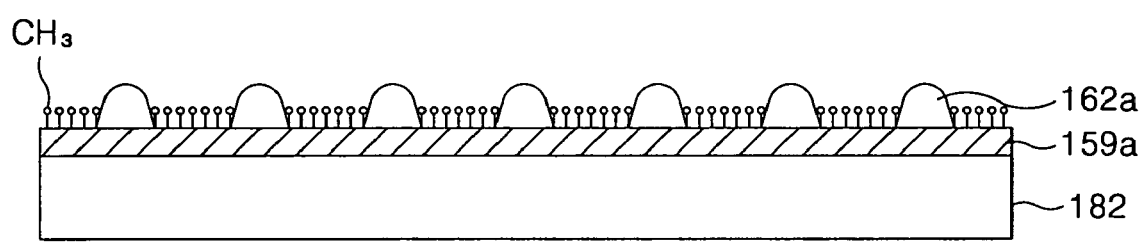

Referring to FIG. 3C, a hydrophilic polymer resin 162 is then spread on the gate metal layer 159a. Because of the hydrophobic radical $CH_3$ attached from the PDMS soft mold 170 on the gate metal layer 159a, the spread hydrophilic polymer resin 162 congregates at areas where the projections 170b of the PDMS soft mold 170 did not contact, that is, areas corresponding to the grooves 170a of the PDMS soft mold 170. Accordingly, a hydrophilic polymer resin pattern 162a is formed on the gate metal layer 159a, as illustrated in FIG. 3D.

Figure 3E:
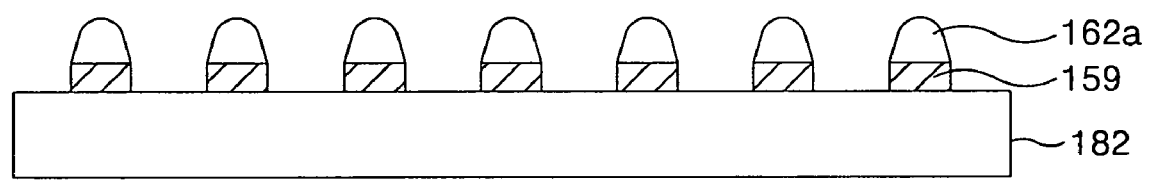
Figure 3F:
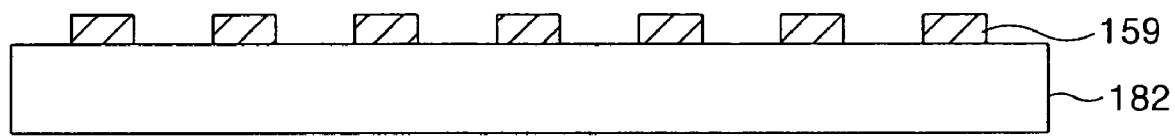

Referring to FIG. 3E, a plurality of gate electrodes 159 are patterned by etching the gate metal layer 159a using the hydrophilic polymer resin pattern 162a as a mask. The hydrophilic polymer resin pattern 162a is then removed by a strip process, thereby forming the gate electrodes 159, as illustrated in FIG. 3F.

As described above, a thin film on a substrate 182 can be patterned by using the PDMS soft mold 170 capable of forming the hydrophobic radical $CH_3$ on the substrate 182 and the hydrophilic polymer resin 162 without exposure and development processes required for a conventional photolithograph process. Accordingly, the patterning method disclosed above does not require a photo-resist material, a developing solution and expensive exposure equipment, and can reduce the fabrication time. Various types of flat panel display devices may be fabricated by a patterning method disclosed above.

Figure 4:
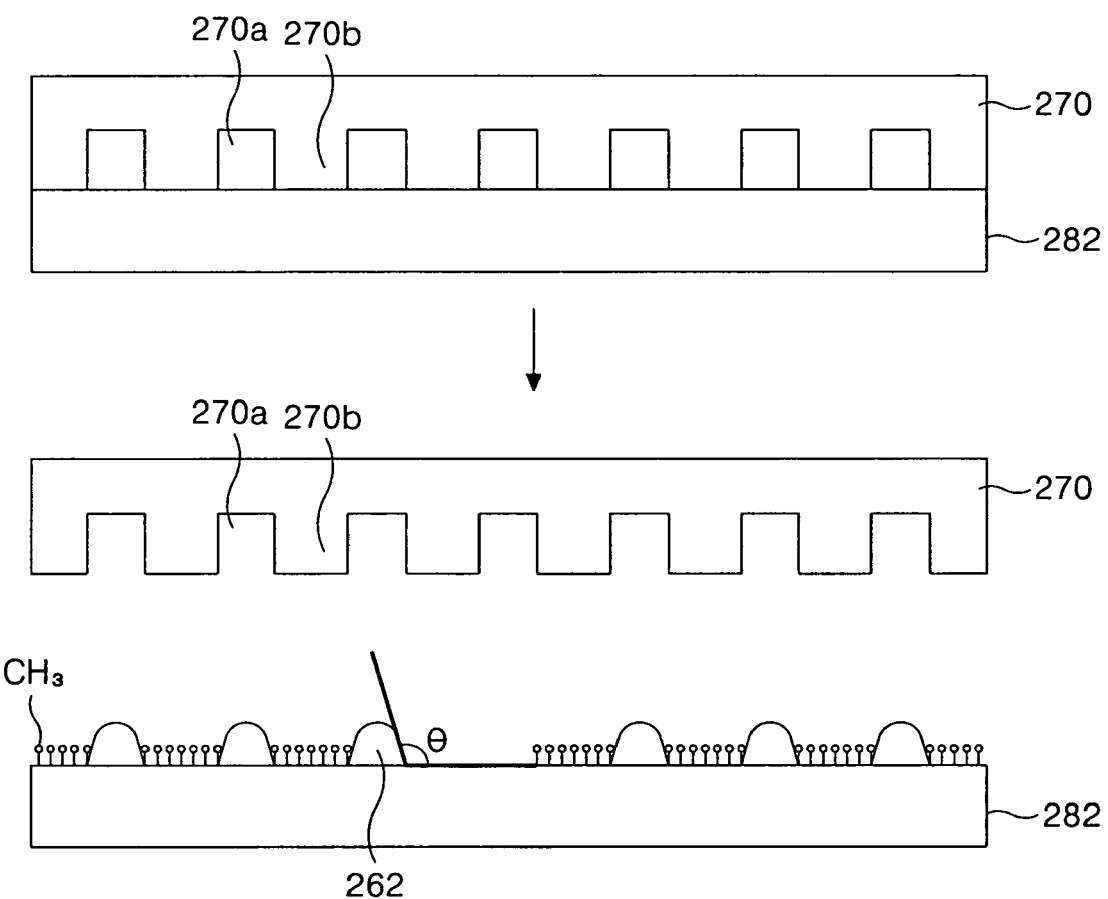
FIG. 4 shows schematic views illustrating a process for forming hydrophobic areas on a substrate with a PDMS soft mold and a heat treatment.
Figure 5:
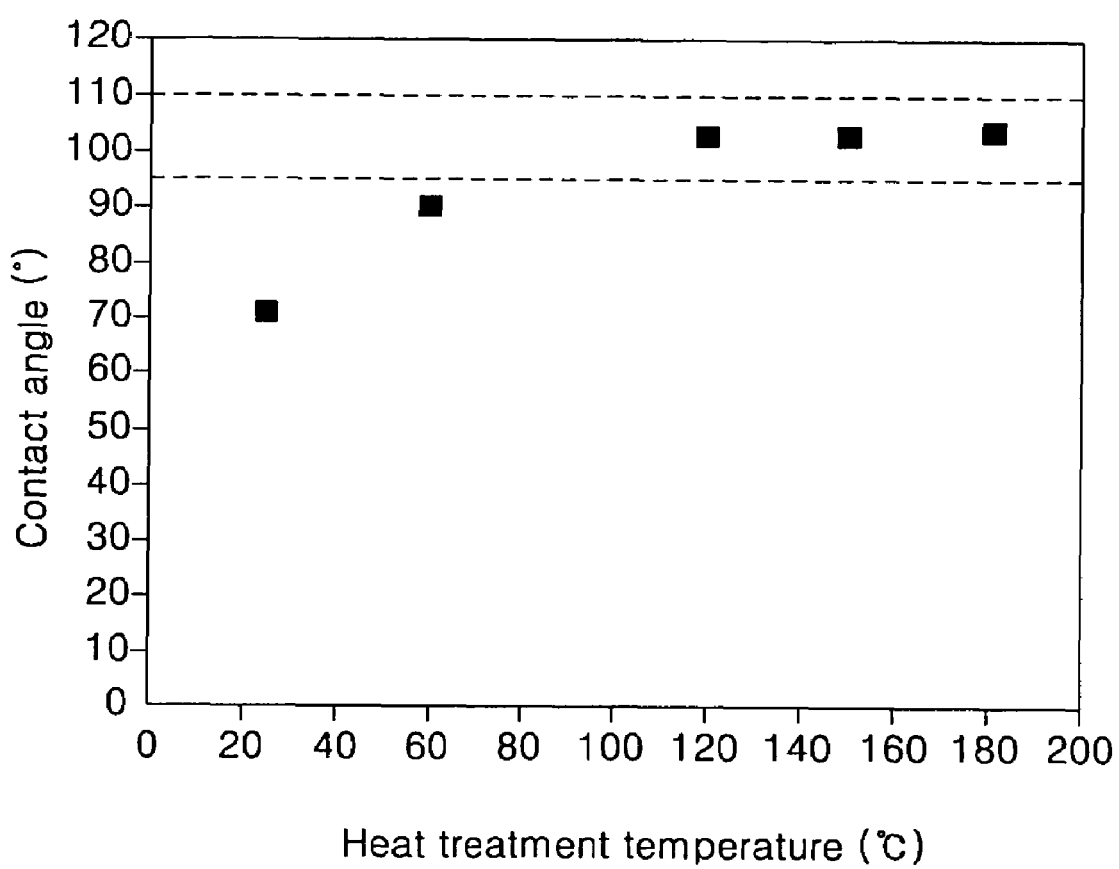
FIG. 5 is a graph representing the relationship between the temperature of the heat treatment and the strength of hydrophobicity.

FIG. 4 shows schematic views illustrating a process for forming hydrophobic areas on a substrate with a soft mold and a heat treatment, and FIG. 5 is a graph representing the relationship between the temperature of the heat treatment and the strength of hydrophobicity.

Referring to FIG. 4 and FIG. 5, a substrate 282 is contacted with a PDMS soft mold 270 and is treated with heat at a temperature in a range of about 20° C. to about 200° C. The strength of hydrophobicity of the substrate 282 contacted with projections 270b of the PDMS soft mold 270 is measured by a contact angle $\theta$ made by the substrate 282 and water 262 after spreading water 262 on the substrate 282. When the contact angle $\theta$ is equal to or more than 90°, it is determined that the strength of hydrophobicity of the substrate 282 is high. In this experiment, the contact angle $\theta$ of the substrate 282 that is not treated with the PDMS soft mold 270 is 13°.

As the temperature of the heat treatment increases to 25° C. and more, the contact angle $\theta$, the strength of hydrophobicity of the substrate 282, gradually increases to 70°. When the temperature of the heat treatment increases to more than 60° C., the substrate 282 becomes strongly hydrophobic to have the contact angle $\theta$ of 90°. When the temperature of the heat treatment increases to more than 120° C., the contact angle $\theta$ becomes 100° and more. As the temperature of the heat treatment increases to 180° C., the contact angle $\theta$ of more than 100° is maintained.

As disclosed above, according to the method for fabricating a flat panel display device according to the present invention, the substrate 282 is contacted with the PDMS soft mold 270 and treated with heat so that the areas of the substrate 282 contacted with the projections 270b of the PDMS soft mold 270 become strongly hydrophobic. The temperature of the heat treatment capable of forming strong hydrophobic radical $CH_3$ on the substrate 282 is in a range of 25° C. to 200° C., more beneficially, in a range of 120° C. to 180° C. When the temperature increases to more than 250° C., the main PDMS chain of the PDMS soft mold 270 may be broken.

Figure 6:
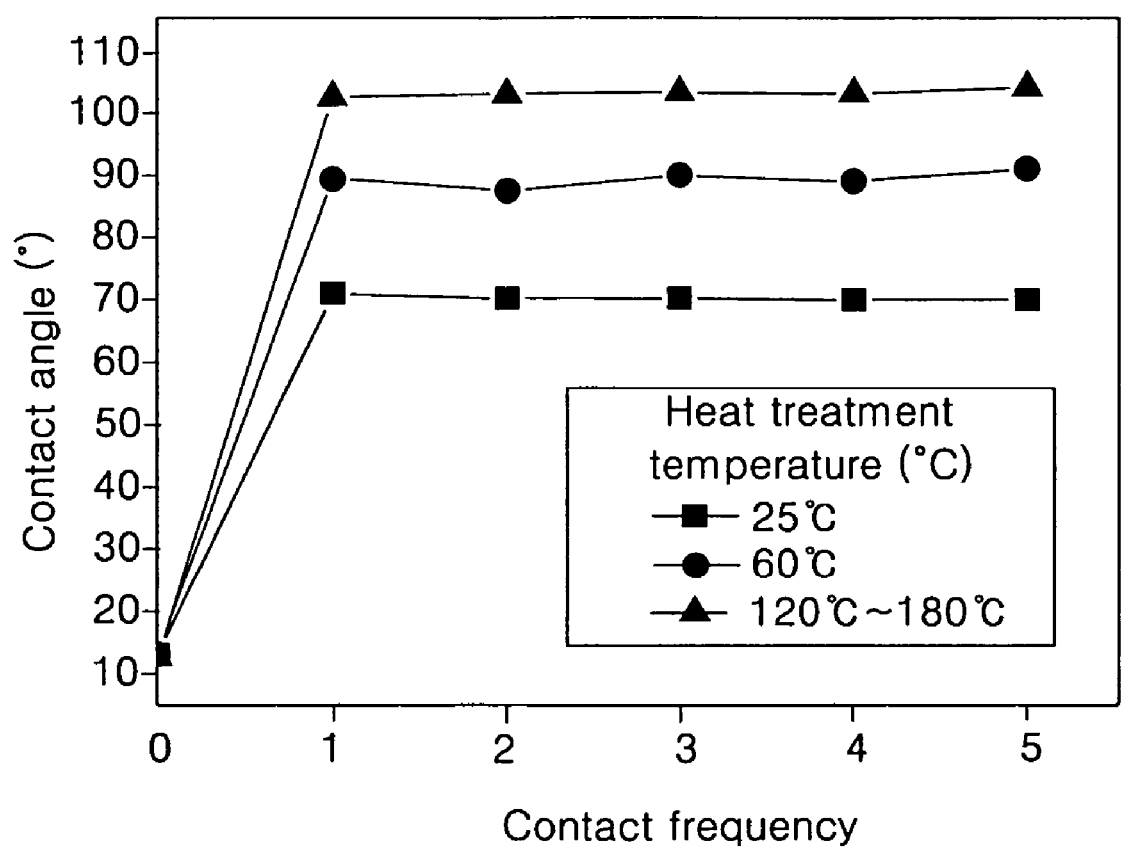
FIG. 6 is a graph representing the relationship between the frequency of the contact and the strength of hydrophobicity.

FIG. 6 is a graph representing the relationship between the frequency of the contact of the PDMS soft mold 270 with the substrate 282 and the strength of hydrophobicity of the substrate 282.

As shown in FIG. 6, the contact angle θ, the strength of hydrophobicity, is not dependent upon the frequency of the contact with which the PDMS soft mold 270 contacts the substrate 282, but is affected by the temperature of the heat treatment.

More specifically, when the substrate 282 is treated with the PDMS soft mold 270 and temperatures of 25° C. and 60° C., the measured contact angles θ made by water 262 and the substrate 282 are respectively about 70° and 90°, irrespective of the frequency of the contact. The contact angle θ is about 100°, when the temperature of the heat treatment is in a range of 120° C. to 180° C., irrespective of the frequency of the contact.

Figure 7:
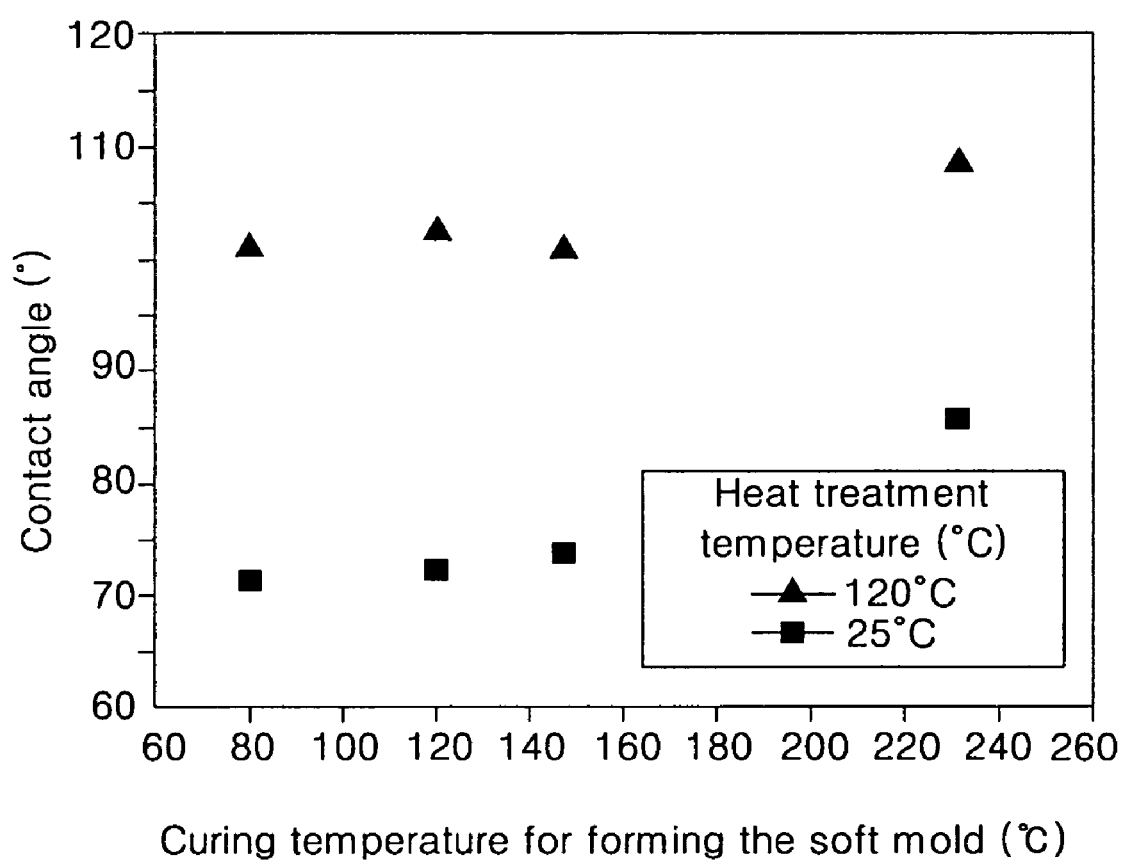
FIG. 7 is a graph representing the relationship between the curing temperature for forming the PDMS soft mold and the strength of hydrophobicity.

FIG. 7 is a graph representing the relationship between the curing temperature for forming the PDMS soft mold 270 and the strength of hydrophobicity of the substrate 282.

As shown in FIG. 7, the contact angle θ, the strength of hydrophobicity, is not dependent upon the curing temperature for forming the PDMS soft mold 270, but is affected by the temperature of the heat treatment.

More specifically, the PDMS soft molds 270 are prepared by curing at a temperature in a range of 80° C. to 240° C. and are contacted with the substrate 282. However, there is insignificant difference in the contact angle θ made by the water 262 and the substrate 282 with the variation of the curing temperature.

Figure 8:
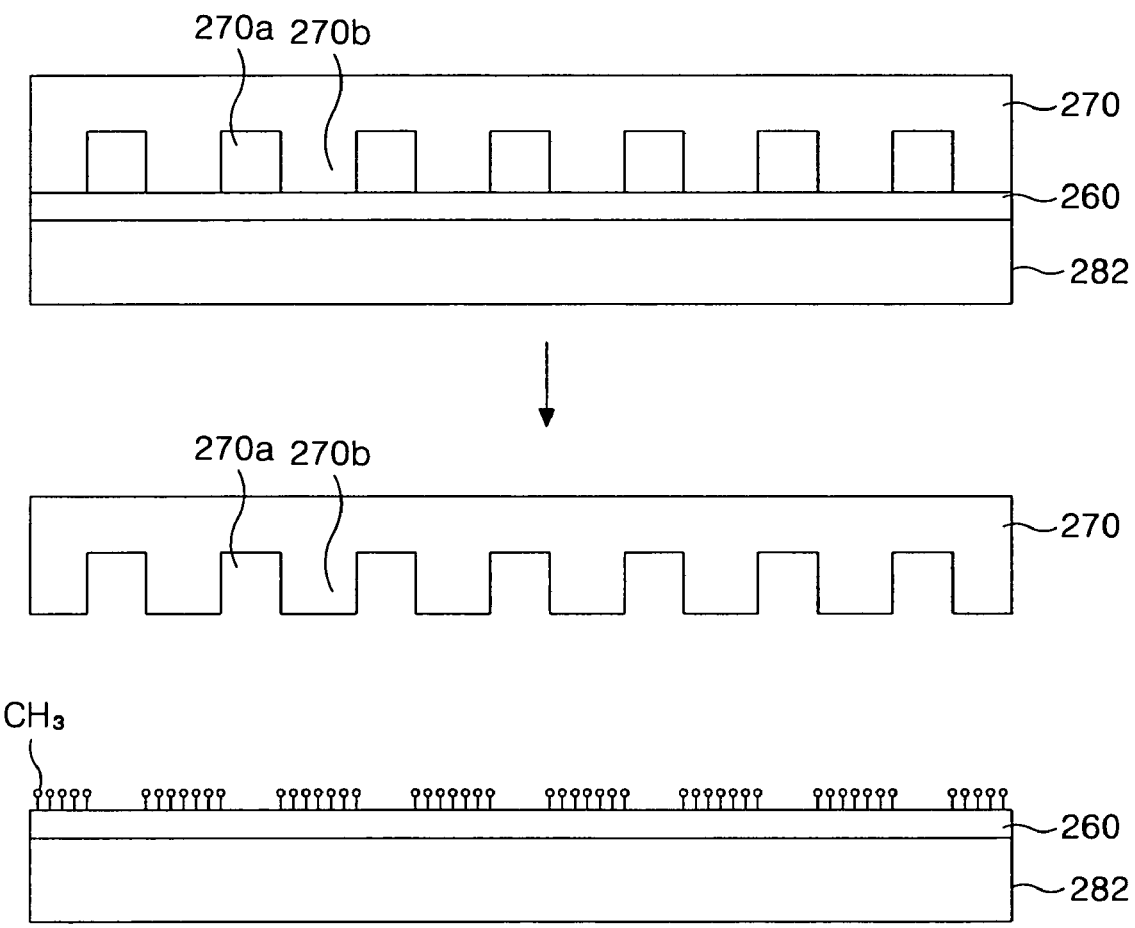
FIG. 8 shows schematic views illustrating a process for forming hydrophobic areas on a substrate having a buffer layer with a PDMS soft mold and a heat treatment.
Figure 9:
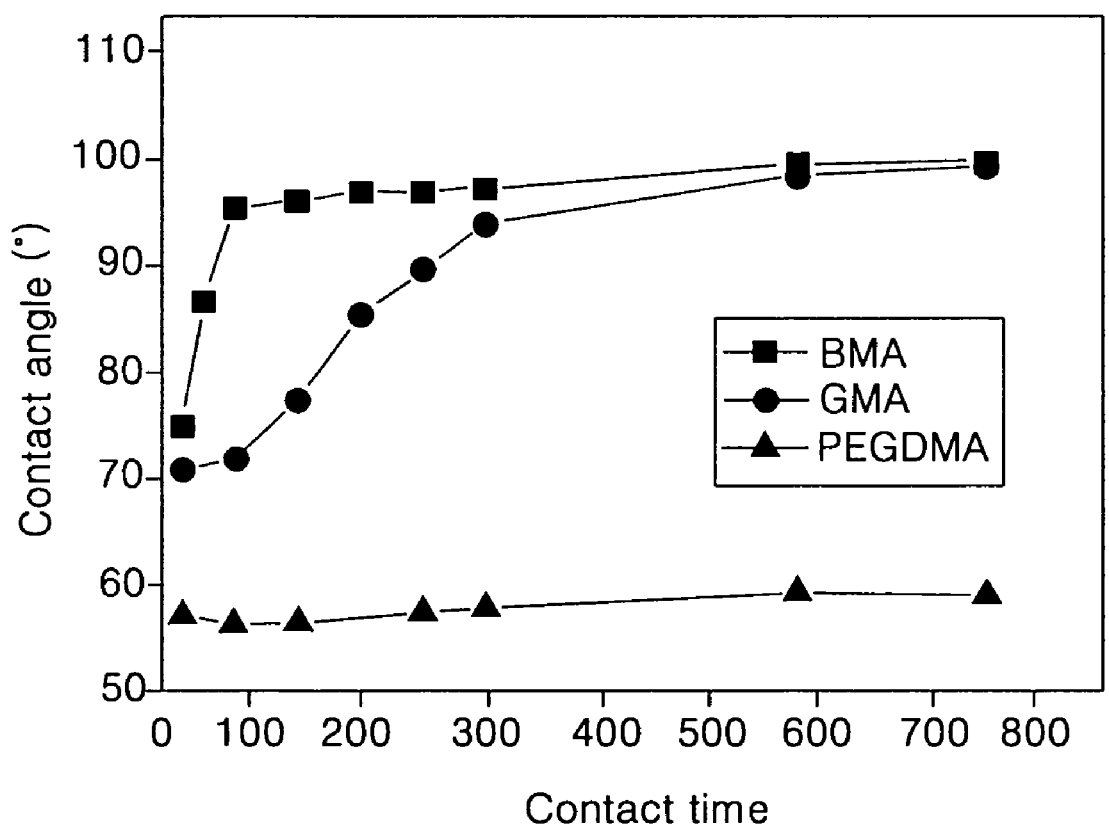
FIG. 9 is a graph representing the relationship between the duration of the contact and the strength of hydrophobicity with a variation of a buffer layer.

FIG. 8 shows schematic views illustrating a process for forming hydrophobic areas on a substrate 282 having a buffer layer 260 with a PDMS soft mold and a heat treatment, and FIG. 9 is a graph representing the relationship between the duration of the contact and the strength of hydrophobicity with a variation of a buffer layer.

The buffer layer 260 is formed by using PEGDMA(Polyethylene glycol dimethacrylate), GMA(Glycidyl methacrylate), BMA(Buthl methacrylate) and etc. The duration of the contact between the PDMS soft mold 270 and the substrate 282 is in a range of 10 seconds to 800 seconds.

Referring to FIG. 8 and FIG. 9, the strength of hydrophobicity of the substrate 282 varies according to a material of the buffer layer 260. When the buffer layer 260 is formed of PEGDMA, the contact angle θ is about 55°, irrespective of the duration of the contact. However, when the buffer layer 260 is formed of GMA, the contact angle θ gradually increases from 70° to 95°, as the duration of the contact increases to 300 seconds. When the buffer layer 260 is formed of BMA, the contact angle θ rapidly increases from 75° to 95°, as the duration of the contact increases to 50 second. Accordingly, it is beneficial that the buffer layer 260 is formed of either GMA or BMA rather than PEGDMA.

Figure 10:
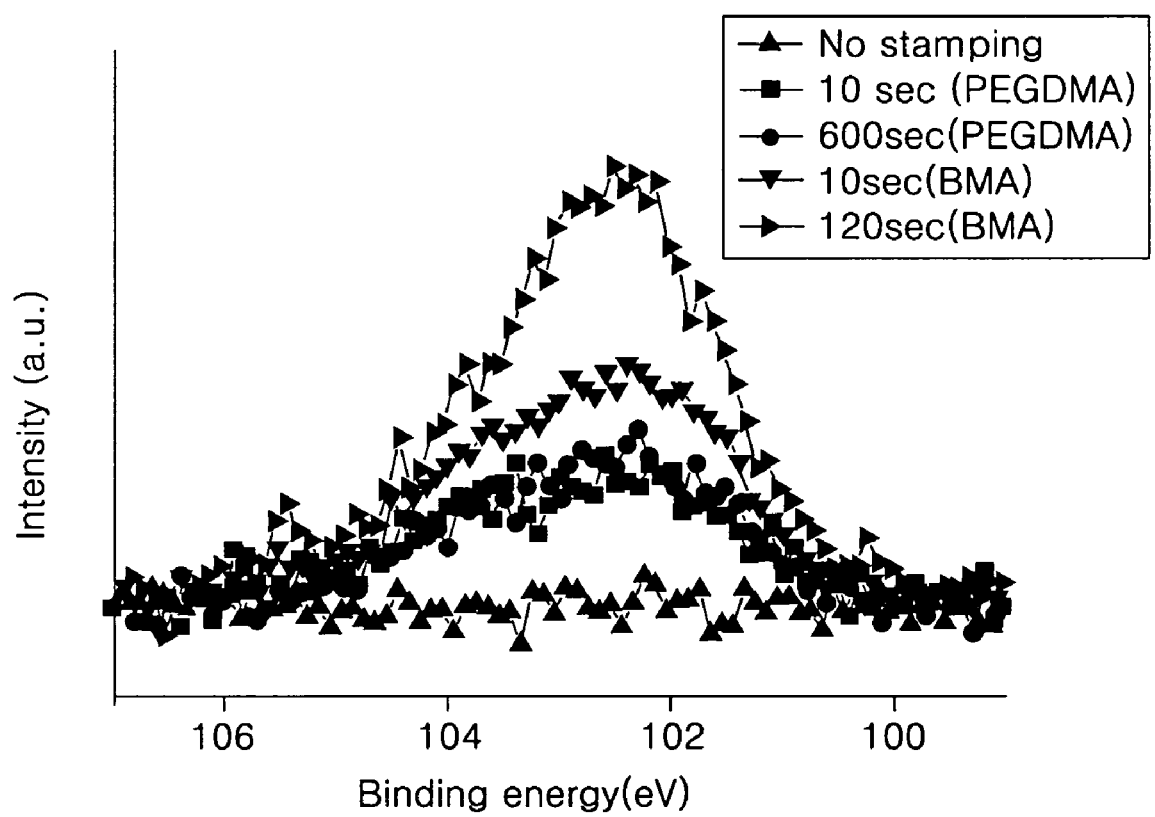
FIG. 10 is XPS data of a BMS buffer layer and a PEGDMA buffer layer contacted with a PDMS soft mold with a variation of the duration of the contact.

FIG. 10 is XPS (X-ray Photoelectron Spectroscopy) data of a BMS buffer layer and a PEGDMA buffer layer contacted with a PDMS soft mold versus the variation of the duration of the contact. The XPS data represents 2p peak value of silicon Si, and the XPS of the PDMS soft mold 270 has a peak value at 102.1 eV. Also, as the intensity at the binding energy of 102.1 eV becomes higher, the substrate 282 having the buffer layer 260, which is contacted with the PDMS soft mold 270, has a stronger hydrophobicity.

Referring to FIG. 10, the intensities of the PEGDMA buffer layer 260 contacted with the PDMS soft mold 270 are low at the binding energy of 102.1 eV, irrespective of the duration of the contact (10 seconds or 600 seconds). On the other hand, the intensity of the BMA buffer layer 260 contacted with the PDMS soft mold 270 for 10 seconds is higher at the binding energy of 102.1 eV than that of the PEGDMA buffer layer 260 contacted with the PDMS soft mold 270 for 600 seconds or that of the BMA buffer layer 260 contacted with the PDMS soft mold 270 for 120 seconds. Thus, when BMA (or GMA) is used to form the buffer layer 260, it has a stronger hydrophobicity than the buffer layer 260 formed of PEGDMA.

FIG. 11 shows the solubility parameters of the PDMS soft mold, PEGDMA, GMA and BMA. The solubility parameter δ of BMA or GMA is more similar to the solubility parameter δ of the PDMS soft mold than the solubility parameter δ of PEGDMA. Specifically, as the value of $(\delta_{resin}-\delta_{PDMS})^2$ is smaller, the hydrophobicity of the buffer layer 260 becomes stronger.

Figure 12:
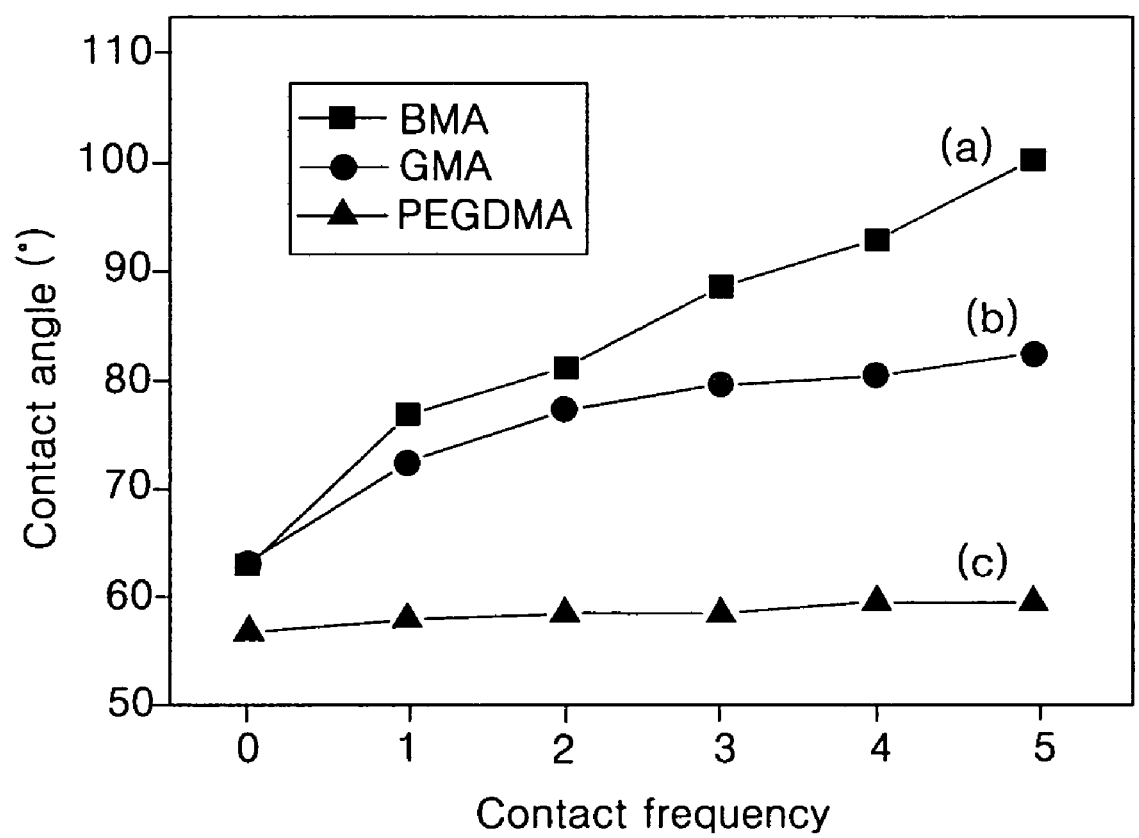
FIG. 12 is a graph representing the relationship between the frequency of the contact and the strength of hydrophobicity with a variation of the buffer layer on the substrate.

FIG. 12 is a graph representing the relationship between the frequency of the contact and the strength of hydrophobicity with a variation of the buffer layer 260 on the substrate 282.

Referring to FIG. 12, the contact angle θ made by water 262 and the substrate 282 having the PEGDMA buffer layer 260, that is the strength of hydrophobicity of the substrate 282 having the PEGDMA buffer layer 260 contacted with the PDMS soft mold 270, is about 55°, irrespective of the frequency of the contact. On the other hand, the contact angle θ for the GMA buffer layer 260 gradually increases from about 70° to about 75° when the frequency of the contact becomes two. The contact angle θ for the BMA buffer layer 260 rapidly increases from 75° to 100° when the frequency of the contact becomes five. Thus, when the buffer layer 260 is formed of either GMA or BMA, the strength of hydrophobicity becomes higher as the frequency of the contact between the PDMS soft mold 270 and the substrate 282 increases, with an exception of the PEGDMA buffer layer 260.

Figure 13:
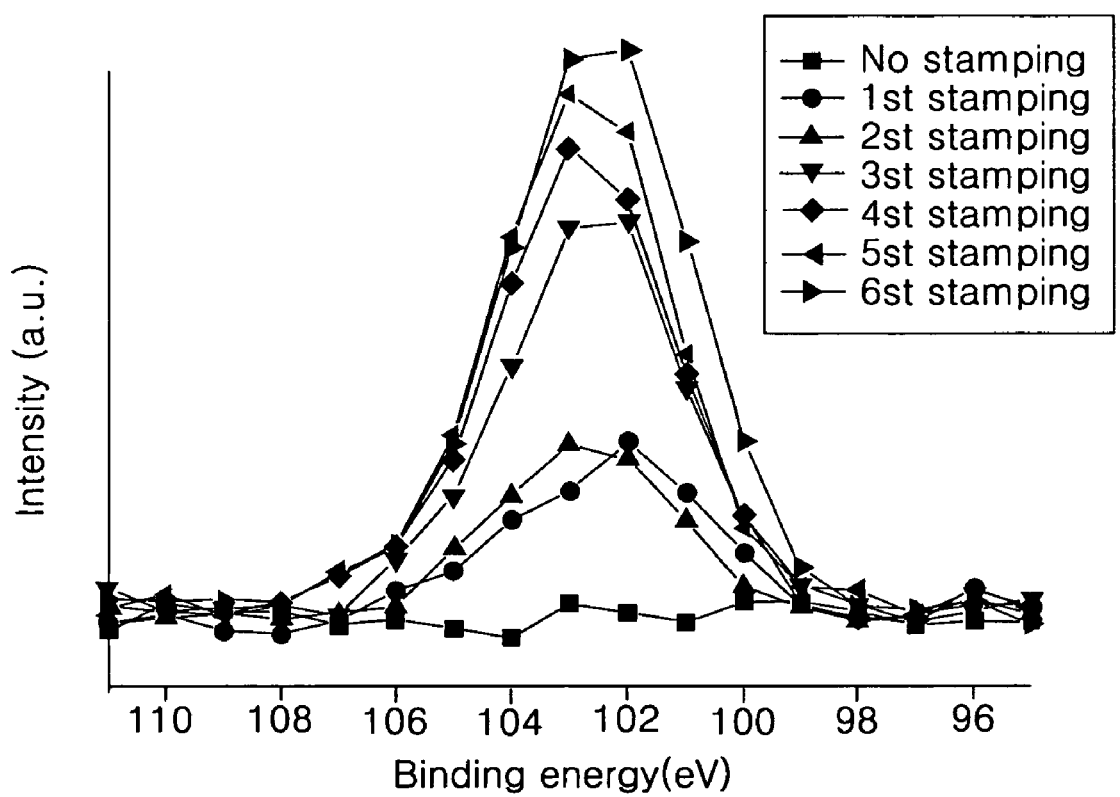
FIG. 13 is XPS data representing the relationship between the strength of hydrophobicity and the frequency of the contact between the PDMS soft mold and the substrate having the BMA buffer layer.

FIG. 13 is XPS data representing the relationship between the strength of hydrophobicity and the frequency of the contact between the PDMS soft mold 270 and the substrate 282 having the BMA buffer layer 260, of which value of $(\delta_{resin}-\delta_{PDMS})^2$ is the smallest.

Referring to FIG. 13, as the frequency of the contact increases, the intensity of the BMA buffer layer 260 becomes higher at the binding energy of 102.1 eV. This means that the strength of hydrophobicity of the BMA buffer layer 260 contacted with the PDMS soft mold 270 becomes higher as the frequency of the contact increases.

As described above, in the method of fabricating a flat display device according to the present invention, a thin film on a substrate can be patterned by using the PDMS soft mold capable of forming the hydrophobic radical $CH_3$ on the substrate and the hydrophilic polymer resin without exposure and development processes required for a conventional photolithography process. Accordingly, it is possible to reduce the fabrication time and the waste of a developing solution for patterning photo-resist. In addition, expensive exposure equipment is not needed for patterning. As a result, it is possible to reduce the manufacturing cost.

In addition, the thin film on the substrate contacted with the PDMS soft mold is treated with heat at a temperature in a range of 25° C. to 200° C. in order to increase the strength of hydrophobicity. Moreover, it is beneficial to increase the strength of hydrophobicity by choosing a buffer layer of which value of $(\delta_{resin}-\delta_{PDMS})^2$ is small and increasing the frequency of the contact between the buffer layer and the PDMS soft mold.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a flat panel display device, comprising:
   providing a thin film on a substrate;
   providing a soft mold having a groove and a projection on the thin film;
   contacting the projection of the soft mold and the thin film;
   treating the substrate with heat to make the contacted area hydrophobic; and
   spreading a hydrophilic polymer resin on the thin film to pattern the thin film.

2. The fabricating method according to claim 1, wherein the step of treating the substrate with heat is performed at a temperature in a range of about 20° C. to 200° C.

3. The fabricating method according to claim 2, wherein the temperature is in a range of about 120° C. to 180° C.

4. The fabricating method according to claim 1, wherein the soft mold includes polydimethylsiloxane (PDMS).

5. The fabricating method according to claim 1, further comprising forming a buffer layer on the thin film.

6. The fabricating method according to claim 5, wherein a duration of the contact between the projection of the soft mold and the buffer layer is in a range of about 5seconds to 800 seconds.

7. The fabricating method according to claim 6, wherein the duration of the contact is in a range of about 50 seconds to 300 seconds.

8. The fabricating method according to claim 6, wherein the buffer layer includes at least one of Glycidyl methacrylate (GMA) and Butyl methacrylate (BMA).

9. The fabricating method according to claim 6, wherein as a frequency of the contact between the projection of the soft mold and the buffer layer increases, a strength of hydrophobicity on a contact area of the buffer layer becomes higher.

10. The fabricating method according to claim 5, wherein the solubility of the buffer layer is substantially the same as the solubility of the soft mold.

11. A fabricating method of a flat panel display device, comprising:
    providing a thin film on a substrate;
    providing a soft mold including a groove and a projection on the thin film;
    contacting the thin film with the projection of the soft mold to make the contacted area hydrophobic;
    treating the substrate with heat to make the contacted area hydrophobic;
    spreading a hydrophilic polymer resin on the thin film to pattern the hydrophilic polymer resin; and
    patterning the thin film using the patterned hydrophilic polymer resin as a mask.

12. The fabricating method according to claim 11, wherein the step of treating the substrate with heat is performed at a temperature in a range of about 25° C. to 200° C.

13. The fabricating method according to claim 12, wherein the temperature is in a range of about 120° C. to 180° C.

14. The fabricating method according to claim 11, wherein the soft mold includes PDMS (polydimethylsiloxane).

15. The fabricating method according to claim 11, further comprising forming a buffer layer on the thin film.

16. The fabricating method according to claim 15, wherein a duration of the contact between the projection of the soft mold and the buffer layer is in a range of about 5seconds to 800 seconds.

17. The fabricating method according to claim 16, wherein the duration of the contact is in a range of about 50 seconds to 300 seconds.

18. The fabricating method according to claim 16, wherein the buffer layer includes at least one of GMA(Glycidyl methacrylate) and BMA Butyl methacrylate).

19. The fabricating method according to claim 16, wherein as a frequency of the contact between the projection of the soft mold and the buffer layer increases, a strength of hydrophobicity on a contact area of the buffer layer becomes higher.

20. The fabricating method according to claim 11, wherein hydrophobic radical $CH_3$ is formed on the contacted area of the substrate.

* * * * *